United States Patent
Kurd et al.

(10) Patent No.: US 10,614,774 B2
(45) Date of Patent: Apr. 7, 2020

(54) DEVICE, METHOD AND SYSTEM FOR ON-CHIP GENERATION OF A REFERENCE CLOCK SIGNAL

(71) Applicant: Intel Corporation, Santa Clara, CA (US)

(72) Inventors: Nasser Kurd, Portland, OR (US); Daniel Ragland, Sherwood, OR (US); Ameya Ambardekar, Hillsboro, OR (US); John Fallin, Beaverton, OR (US); Praveen Mosalikanti, Portland, OR (US); Vaughn J. Grossnickle, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 24 days.

(21) Appl. No.: 16/019,924

(22) Filed: Jun. 27, 2018

(65) Prior Publication Data

US 2020/0005728 A1    Jan. 2, 2020

(51) Int. Cl.
| | | |
|---|---|---|
| *G09G 5/00* | (2006.01) | |
| *G06F 1/26* | (2006.01) | |
| *G06F 1/04* | (2006.01) | |
| *H03L 7/08* | (2006.01) | |

(52) U.S. Cl.
CPC ............... *G09G 5/008* (2013.01); *G06F 1/04* (2013.01); *G06F 1/26* (2013.01); *H03L 7/08* (2013.01)

(58) Field of Classification Search
CPC .. G09G 5/008; G06F 1/04; G06F 1/26; H03L 7/08; H03L 7/06; H03L 7/00; H03L 5/00
See application file for complete search history.

(56) References Cited

U.S. PATENT DOCUMENTS

| | | | | |
|---|---|---|---|---|
| 5,822,573 | A * | 10/1998 | Saeki | G06F 1/10 713/503 |
| 6,140,883 | A | 10/2000 | Thomas | |
| 2003/0197537 | A1 | 10/2003 | Saint-Laurent | |
| 2005/0046489 | A1* | 3/2005 | Cranford, Jr. | H03L 7/08 331/25 |
| 2008/0122421 | A1* | 5/2008 | Hsieh | G06F 1/3203 323/318 |
| 2008/0218195 | A1 | 9/2008 | Kajita | |
| 2008/0246525 | A1 | 10/2008 | Bazes | |

(Continued)

OTHER PUBLICATIONS

International Search Report & Written Opinion dated Sep. 18, 2019 for PCT Patent Application No. PCT/US2019/034099.

*Primary Examiner* — Hong Zhou
(74) *Attorney, Agent, or Firm* — Green, Howard & Mughal LLP

(57) ABSTRACT

Techniques and mechanisms for an integrated circuit (IC) chip to generate a clock signal for use by one or more resources of the IC chip. In an embodiment, a clock signal is generated with phase-locked loop (PLL) circuitry of an IC chip based on a cyclical signal which is provided to the IC chip by an external source. A supply voltage provided to the PLL circuitry is automatically updated based on one of a requested frequency for the clock signal, a frequency of the received cyclical signal, or a voltage of a control signal used by a voltage controlled oscillator of the PLL circuitry. In another embodiment, a series of incremental changes to a frequency of the clock signal is automatically performed according to a predefined overclocking scheme or underclocking scheme.

17 Claims, 10 Drawing Sheets

(56) References Cited

U.S. PATENT DOCUMENTS

| | | | |
|---|---|---|---|
| 2008/0284524 A1* | 11/2008 | Kushiyama | H03L 7/0893 331/10 |
| 2013/0249610 A1* | 9/2013 | Hara | H03L 7/00 327/159 |
| 2014/0103973 A1* | 4/2014 | Kurd | G06F 1/08 327/156 |
| 2017/0005665 A1 | 1/2017 | Swaminathan et al. | |

* cited by examiner

DEVICE, METHOD AND SYSTEM FOR ON-CHIP GENERATION OF A REFERENCE CLOCK SIGNAL

BACKGROUND

1. Technical Field

The present invention relates generally to the clocking of integrated circuitry and more specifically, but not exclusively, to an automatic configuration of circuitry for generating a reference clock signal.

2. Background Art

Conventional computer architectures variously provide a central processing unit (CPU) die and some external source which is coupled to send to the CPU die a digital clock signal—often referred to as a "base clock"—for use in generating one or more local clock signals. One or more synchronous domains of such a CPU die variously operate each based on a respective local clock signal which, in turn, is based on the received base clock signal.

Overclocking or underclocking of many synchronous domains of a CPU die can be efficiently achieved by changing a frequency of the base clock signal. However, CPU dies in existing computer architectures are dependent on external clock control logic to implement this type of overclocking or underclocking. This dependence usually requires additional conductive contacts (e.g., pins, pads, balls, or the like), interconnects and/or other resources to enable clock control signaling between the CPU die and the external clock control logic. Furthermore, CPU dies are often constrained by external clock control logic which is not designed for a sufficiently wide range of possible frequencies for the base clock. Further still, the maximum allowable frequency of a base clock signal is often limited by the type of interconnect which is used to communicate the base clock signal to a CPU die.

As successive generations of integrated circuit technology continue to support increased operational frequencies of computer architectures, there is expected to be an increasing demand for incremental improvements to systems for clocking these computer architectures.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Figure 1:
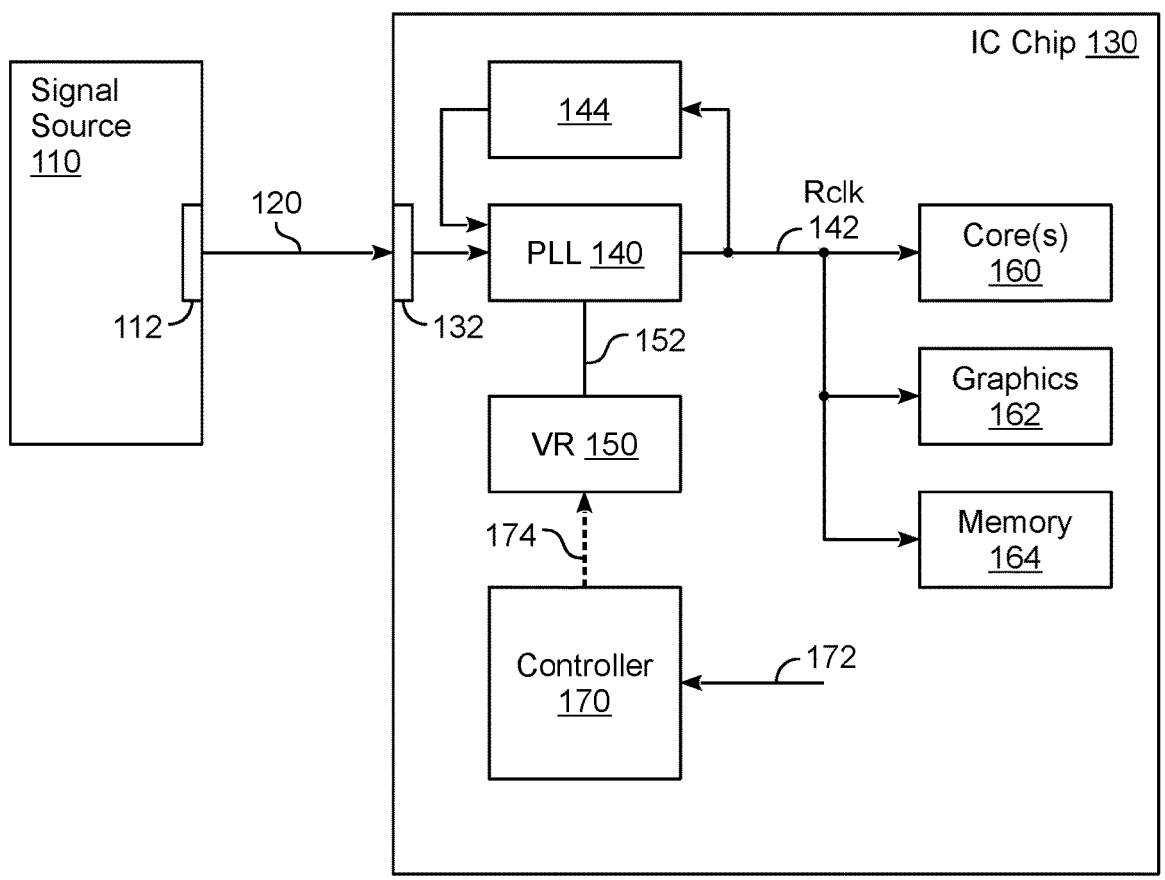
FIG. 1 is a high-level functional block diagram illustrating elements of a system to provide clocking of integrated circuitry according to an embodiment.

Embodiments discussed herein variously provide techniques and mechanisms for an integrated circuit (IC) chip to control local generation of a clock signal which is used by a processor and/or other resources of the IC chip. Such local generation of a clock signal by an IC chip may be based on a cyclical signal which is provided to the IC chip by an external source. In some embodiments, the cyclical signal received by the IC chip is an analog signal generated (for example) by a crystal oscillator.

Such a clock signal may provide "reference clock" functionally similar to that of a type of digital clock signal (often referred to as a "base clock signal") which, in conventional clocking architectures, is provided from off-chip to an IC chip. As compared to these conventional clocking architectures, on-chip generation of a reference clock signal enables a significantly wider range of available clock frequencies. To accommodate such a wider range, some embodiments variously enable automatic updates to the powering of on-chip circuitry which is used to generate the clock signal. Alternatively or in addition, a series of changes to the frequency of a clock signal may be performed automatically according to a predefined "frequency crawl" scheme.

As used herein, "reference clock signal" refers to a digital clock signal which facilitates synchronized operation of at least some set of resources of an IC chip, where the reference clock signal is generated at an IC chip based on a cyclical signal which is provided to the IC chip by an external source which is coupled thereto. A given set of resources (also referred to as a "synchronous domain") may be clocked with the reference clock signal itself, or with another clock signal which is generated based on the reference clock signal. For example, the reference clock signal may be provided for one or more locked loop circuits (e.g., PLLs, FLLs) which each perform a respective frequency multiplication to generate another clock signal for a corresponding synchronous domain of the IC chip. Some embodiments are described with reference to the on-chip generation of a clock signal which enables operation of a processor of an IC chip. However, this description may be extended to apply to on-chip generation of a clock signal for operation of any of various additional or alternative resources of an IC chip. Unless otherwise indicated herein, a "clock signal" may be a reference clock signal or, alternatively, another clock signal which is generated based on such a reference clock signal. Also, unless otherwise indicated herein, a "cyclical signal" may be a reference clock signal or, alternatively, a signal provided to an IC chip by an off-chip resource for on-chip generation of a reference clock signal. For example, a cyclical signal may be an analog (e.g., sinusoidal) signal from a crystal oscillator of an off-chip source.

Certain features of various embodiments are described herein with reference to phase-locked loop (PLL) circuitry for generating a clock signal based on a feedback signal. Such PLL circuitry may include or be coupled to a circuit (referred to herein as a "frequency divider circuit") which generates the feedback signal by applying a frequency division to a sampled version of the clock signal. Alternatively, the PLL circuitry may include such a frequency multiplier circuit, in various embodiments. One or more additional frequency divider circuits and/or frequency multiplier circuits may be variously coupled to operate on clock signaling upstream or downstream of such PLL circuitry, in various embodiments. Some embodiments are not limited to a particular frequency division or frequency multiplication for use in generating a clock signal.

The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, laptop computers, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. More generally, the technologies described herein may be employed in any of a variety of electronic devices including an integrated circuit chip operable to generate a clock signal.

In the following description, numerous details are discussed to provide a more thorough explanation of the embodiments of the present disclosure. It will be apparent to one skilled in the art, however, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate a greater number of constituent signal paths, and/or have arrows at one or more ends, to indicate a direction of information flow. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

It is to be understood that the terms so used are interchangeable under appropriate circumstances such that the embodiments of the invention described herein are, for example, capable of operation in other orientations than those illustrated or otherwise described herein.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C. It is pointed out that those elements of a figure having the same reference numbers (or names) as the elements of any other figure can operate or function in any manner similar to that described, but are not limited to such.

In addition, the various elements of combinatorial logic and sequential logic discussed in the present disclosure may pertain both to physical structures (such as AND gates, OR gates, or XOR gates), or to synthesized or otherwise optimized collections of devices implementing the logical structures that are Boolean equivalents of the logic under discussion.

It is pointed out that those elements of the figures having the same reference numbers (or names) as the elements of any other figure can operate or function in any manner similar to that described, but are not limited to such.

FIG. 1 shows features of a system 100 to provide on-chip clock signal generation according to an embodiment. System 100 is one example of an embodiment wherein an integrated circuit (IC) chip supports functionality to automatically regulate a supply voltage that is provided to phase-locked loop circuitry of the IC chip, wherein the phase-locked loop circuitry is used to generate a reference clock signal.

As shown in FIG. 1, system 100 comprises an IC chip 130, a first circuit of which includes at least phase-lock loop circuitry PLL 140 that is coupled to receive a cyclical signal (such as the illustrative cyclical signal 120 shown) provided to IC chip 130. For example, IC chip 130 and an external signal source 110 of system 100 may be coupled to one another via respective hardware interfaces 112, 132—e.g., wherein a crystal oscillator (not shown) or other such component of signal source 110 generates cyclical signal 120 for communication to IC chip 130. A second circuit of IC chip 130 (such as the illustrative voltage regulator circuit VR 150 shown) may be coupled to provide a supply voltage 152 to phase-lock loop circuitry PLL 140. In such an embodiment, PLL 140 may generate a reference clock signal RClk 142 based on both cyclical signal 120 and supply voltage 152. Supply voltage 152 may be a basis for the generation of RClk 142 at least insofar as supply voltage 152 powers operation of PLL 140, where such operation provides a frequency of RClk 142 which is based at least in part on a frequency of cyclical signal 120. For example, PLL 140 may comprise a voltage control oscillator (VCO) which uses supply voltage 152 to facilitate a requested frequency multiplication. Alternatively or in addition, determining the frequency of RClk 142 may be further based on RClk 142 being provided as a feedback signal to a frequency divider circuit 144 that is coupled to (or alternatively, included in) PLL 140. Operation of PLL 140 may be further responsive to one or more other control signals (not shown) which, for example, are adapted from any of various conventional phase locked loop techniques.

Clock signal RClk 142 may be provided to any of a variety of one or more other components of IC chip 130—e.g., wherein RClk 142 is used to provide a synchronous domain within one such component and/or between multiple such components. In the example embodiment shown, one or more processors (e.g., including the illustrative one or more processor cores 160 shown) are coupled to receive RClk 142 from PLL 140. Alternatively or in addition, a graphics processor 162, a memory 164 and/or one or more other circuit components may variously receive and operate based on RClk 142. In some embodiments, RClk 142 is additionally or alternatively used as a base clock for one or more phase locked loop circuits and/or frequency locked loop circuits (not shown) to variously perform frequency multiplication for generating other respective clock signals.

In conventional clocking schemes, a digital "base" clock signal of an overall system is provided to an IC chip from some external source via an interconnect. Such a base clock signal is then to function as a reference clock at said IC chip. However, these conventional schemes are typically constrained to a maximum signal frequency which is allowed by the interconnect used to communicate the base signal to the IC chip in question. By generating a reference clock signal locally at IC chip 130 (for example), some embodiments variously avoid this type of frequency constraint being directly limiting on RClk 142. Moreover, some embodiments further exploit this advantage by supporting an automatic voltage regulation functionality which enables PLL 140 to dynamically update to a range of possible frequencies for RClk 142. For example, such a range of possible frequencies may be increased or otherwise modified by updating a level of a supply voltage which is provided to PLL 140.

In the example embodiment shown, a third circuit of IC chip 130 (such as the illustrative controller 170 shown) is coupled to provide to VR 150 a control signal 174 which, at a given time, may specify or otherwise indicate that a level of supply voltage 152 is to be changed. Controller 170 may receive a signal 172 indicating a current (or expected) condition of the providing of RClk 142 based on cyclical signal 120 and supply voltage 152. Such a condition may include, for example, one or more of a frequency requested by, or otherwise on behalf of, processor core 160 (or some other such sink of RClk 142), a current frequency of cyclical signal 120, or a level of a control voltage at PLL 140. In one such embodiment, the control voltage at PLL 140 is a voltage of a control signal received at a VCO of PLL 140. Signal 172 may be generated by any of a variety of sensors, control circuitry and/or other mechanisms (not shown) which are operable to monitor and communicate state of IC chip 130. Such generation of signal 172 may include operations adapted from circuit monitoring techniques, which are not detailed herein to avoid obscuring certain features of various embodiments.

In an embodiment, controller 170 performs an evaluation, based on a predefined threshold level, to determine whether the condition indicated by signal 172 meets a criteria for automatically changing a level of supply voltage 152. The evaluation may be based on a state of IC chip 130 (e.g., the state including predefined reference information) which corresponds threshold levels of a given parameter each with a different respective level of supply voltage 152. For example, controller 170 may include or otherwise have access to a memory or other resource which is to provide such predefined reference information. A threshold parameter indicated by the predefined reference information may comprise, for example, one of a requested clock frequency parameter, a cyclical signal frequency parameter, or a control voltage level parameter.

For example, control signal 174 may be based on an evaluation wherein controller 170 detects whether a reference clock frequency requested by or otherwise on behalf of a resource (such as processor core 160) is greater than—or alternatively, less than—a predefined threshold frequency for RClk 142. In such an embodiment, the detecting uses predefined reference information (or other state of IC chip 130) which specifies or otherwise indicates a correspondence of the predefined threshold frequency with a current level of supply voltage 152. For example, the threshold frequency may be defined as corresponding to a range of voltage levels which includes the current level of supply voltage 152.

Alternatively or in addition, the evaluation may comprise controller 170 detecting that a current frequency of cyclical signal 120 is less than a predefined threshold frequency of cyclical signal 120—e.g., wherein the predefined threshold frequency is defined by reference information (or other state of IC chip 130) as corresponding to a current frequency of RClk 142. Alternatively or in addition, the evaluation may comprise controller 170 detecting that a control voltage at PLL 140 (e.g., a voltage of a control signal to operate a VCO) is greater (or alternatively, lower) than a predefined threshold level of the control voltage. The predefined threshold level may be defined by state of IC chip 130 as corresponding to a current level of supply voltage 152. Based on such an evaluation, controller 170 may automatically indicate with control signal 174 that supply voltage 152 is to be changed. Responsive to such indicating with control signal 174, VR 150 may increase or otherwise change a level of supply voltage 152.

Figure 2:
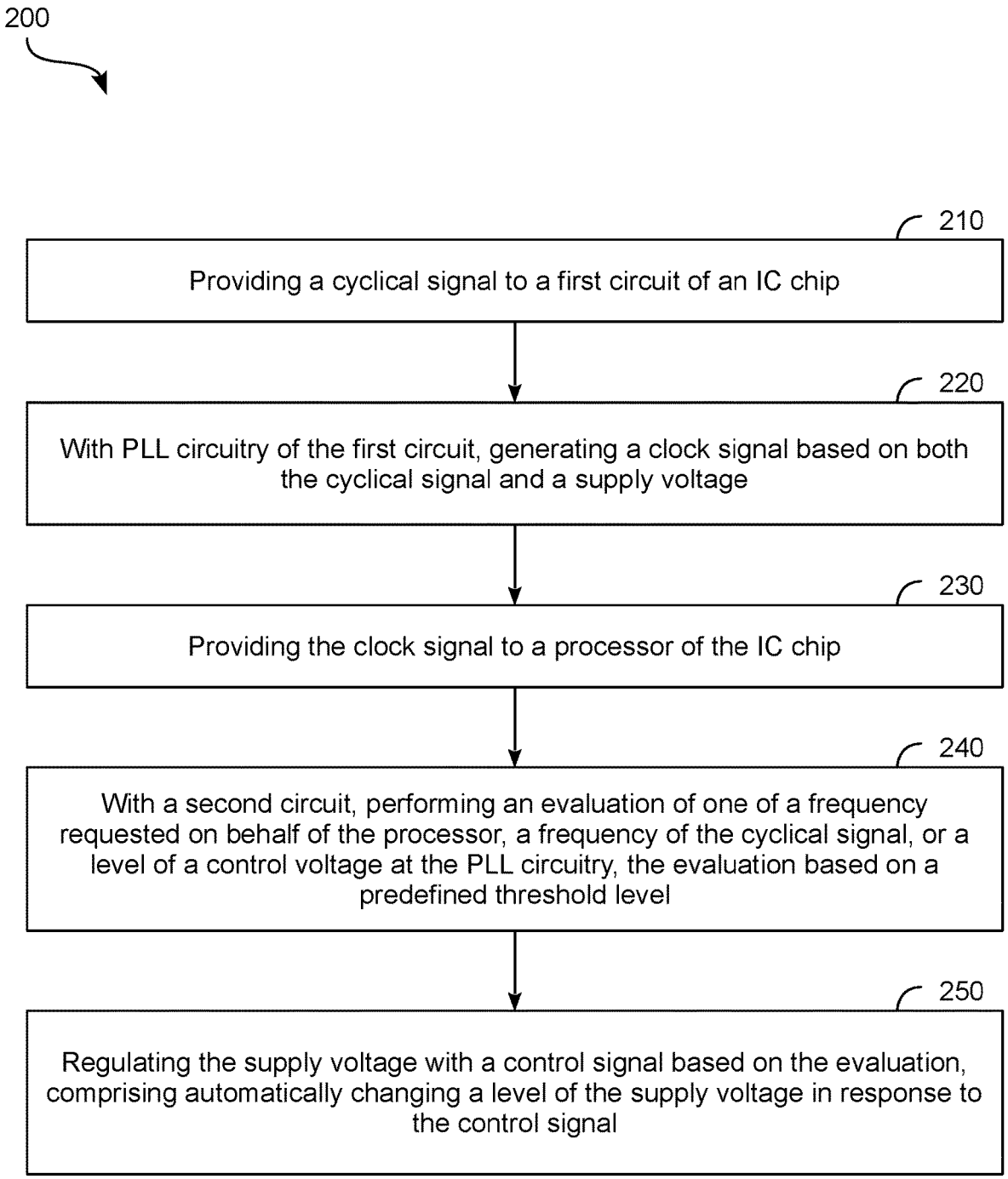
FIG. 2 is a flow diagram illustrating elements of a method to generate a clock with an integrated circuit (IC) chip according to an embodiment.

FIG. 2 shows features of a method 200 to generate a clock signal at an IC chip according to an embodiment. Method 200 is one example of an embodiment wherein an IC chip (e.g., including processor logic) automatically changes a supply voltage, wherein a clock signal is generated with PLL circuitry of the IC chip based on both the supply voltage and a cyclical signal which is provided to the IC chip. Method 200 may be performed at IC chip 130, for example.

As shown in FIG. 2, method 200 may include (at 210) providing a cyclical signal to a first circuit of an IC chip—e.g., wherein the first circuit is or otherwise includes PLL 140 (or other such phase locked-loop circuitry). The cyclical signal may be received at the IC chip from an external signal source which is coupled thereto. Such receiving may include IC chip 130 receiving cyclical signal 120 via a conductive contact (e.g., a pad, a via structure, a solder connection, or the like) of hardware interface 132. In some embodiments, the cyclical signal is a sinusoidal (or other) analog signal which, for example, is generated with a crystal oscillator of a signal source. In other embodiments, the cyclical signal is generated by other circuitry of the IC chip—e.g., wherein the cyclical signal is a reference clock signal or is another clock signal which (for example) is generated based on such a reference clock signal.

In an embodiment, method 200 further comprises (at 220) generating, with PLL circuitry of the first circuit, a clock signal based on both the cyclical signal and a supply voltage (same comment on effect of supply voltage on REF) which is provided to the PLL circuitry. For example, method 200 may further include a voltage regulator of the IC chip (such as VR 150) providing the supply voltage to a VCO circuit of the PLL circuitry. Such a voltage regulator may be operable to provide any of a variety of different levels of the supply voltage at different times.

Method 200 may further comprise (at 230) providing the clock signal to one or more circuit components of the IC chip. In the example embodiment shown, the providing at 230 includes the clock signal being provided to at least a processor of the IC chip. Based on the providing at 230, one or more synchronous domains of the IC chip may be provided. Alternatively or in addition, communication via one or more busses of the IC chip may be synchronized with a reference clock signal (or with a local clock signal which is generated at the IC chip based on the reference clock signal).

In an embodiment, method 200 further comprises (at 240) performing, with a second circuit, an evaluation of one of a frequency requested on behalf of the processor, a frequency of the cyclical signal, or a level of a control voltage at the PLL circuitry, the evaluation based on a predefined threshold level. Such an evaluation may be performed at 240 by controller 170, for example, based on signal 172 and (in some embodiments) based on predefined reference information, or other state of the IC chip, which identifies a correspondence of a various threshold levels of a given parameter each with a different respective level of the supply voltage. The predefined reference information or other such state of the IC chip may correspond threshold levels of a parameter each with a different respective level of the supply voltage. The parameter may comprise one of a requested clock frequency parameter, a cyclical signal frequency parameter, or a control voltage level parameter.

For example, performing the evaluation at 240 may comprise detecting that the frequency requested on behalf of the processor is greater than a predefined threshold frequency of the clock signal. Such a predefined threshold frequency may be identified at controller 170 (for example) as corresponding to a current level of the supply voltage—e.g., wherein an exceeding of the threshold frequency is indicative that the current level of the supply voltage is at risk of being insufficient for the frequency requested on behalf of the processor.

Alternatively or in addition, performing the evaluation at 240 may comprise detecting that the frequency of the cyclical signal (provided to the first circuit at 210) is less than a predefined threshold frequency of the cyclical signal. Such a predefined threshold frequency may correspond to a current frequency of the clock signal—e.g., wherein the cyclical signal being below the threshold frequency is indicative that, given the current frequency of the clock signal, the current level of the supply voltage is at risk of being insufficient for providing a requested frequency of the clock signal.

Alternatively or in addition, performing the evaluation at 240 may comprise detecting that the control voltage at the PLL circuitry is greater than a predefined threshold level of the control voltage. Such a predefined threshold level may correspond to a current level of the supply voltage—e.g., wherein the control voltage exceeding the threshold level is indicative that the current level of the supply voltage is at risk of being insufficient for providing a corresponding frequency of the clock signal.

Method 200 may further comprise (at 250) regulating the supply voltage with a control signal based on the evaluation performed at 240. The regulating at 250 may comprise automatically changing a level of the supply voltage in response to the control signal. For example, performing the evaluation at 240 may comprise detecting that a requested frequency for the clock signal—e.g., requested on behalf of the processor—is greater (or alternatively, is lower) than a predefined threshold frequency. In such an embodiment, the regulating at 250 may comprise the VR 150 increasing (or alternatively, decreasing) the supply voltage 152 and, with the increased (or decreased) supply voltage 152, PLL 140 increasing (or alternatively, decreasing) a frequency of RClk 142 to the requested frequency.

In some embodiment, method 200 further comprises one or more additional operations (not shown) to automatically perform, according to a predefined scheme, a series of incremental changes to RClk 142 from some current frequency to a target frequency. For brevity, such a series is referred to herein as a "frequency crawl." By way of illustration and not limitation, method 200 may further include the second circuit (e.g., comprising controller 170), accessing one or more parameters of an overclock scheme which—for example—is stored by or otherwise preconfigured at the IC chip. The one or more parameters may specify one or more of a magnitude of an incremental frequency change (e.g., an incremental frequency increase), a time duration of an incremental frequency change, and a final target frequency of the clock signal. Based on the one or more parameters, the second circuit may signal the first circuit to perform a series of incremental increases (or alternatively, decreases) to a frequency of the clock signal.

In some embodiments, the voltage regulator automatically changes a level of the supply voltage during the series of incremental changes to the frequency of the clock signal. For example, performing the evaluation at 240 may comprise detecting that a next frequency of the clock signal (i.e., a next frequency according to the predefined scheme) exceeds a threshold frequency which corresponds to a current level of the voltage supply. In such an embodiment, the regulating at 250 may comprise increasing the level of the supply voltage so that a VCO circuit of the PLL circuitry is enabled to facilitate the next frequency of the clock signal.

Figure 3:
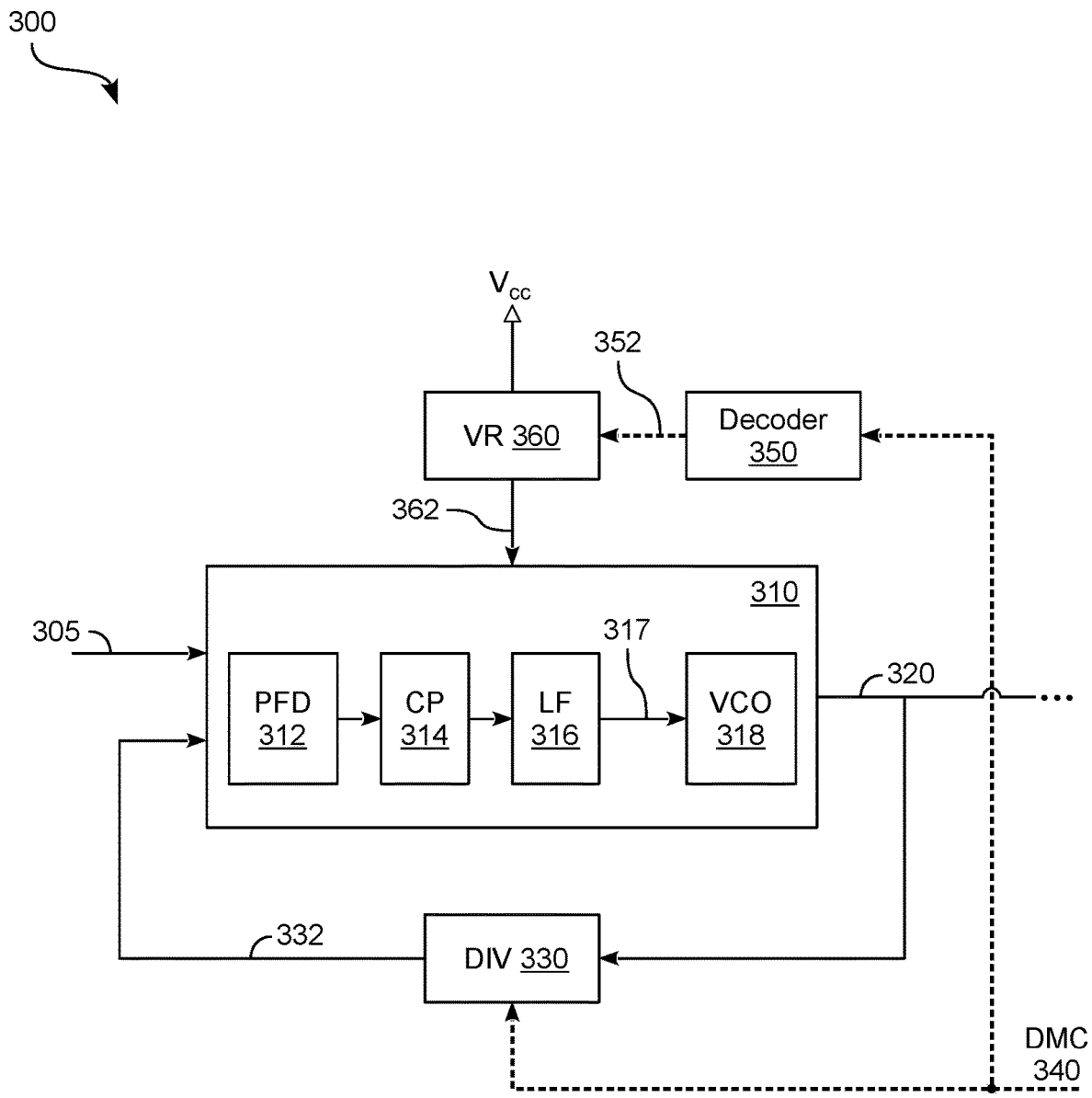
FIGS. 3 through 7 are high-level functional block diagrams each illustrating elements of a respective IC chip to generate a clock signal according to a corresponding embodiment.

FIG. 3 shows features of an IC chip 300 to generate a clock signal according to an embodiment. IC chip 300 is one example of an embodiment wherein circuitry of a chip comprising a processor is operable to automatically change a supply voltage, wherein a clock signal is generated with PLL circuitry of the chip based on both the supply voltage and a cyclical signal. IC chip 300 may include some or all of the features of IC chip 130 and/or may operate according to method 200, for example.

As shown in FIG. 3, IC chip 300 includes a phase-locked loop (PLL) circuit 310—corresponding functionally to PLL 140, for example—which is operable to generate a clock signal 320 based on a cyclical signal 305. Clock signal 320 may be a reference clock signal—e.g., wherein IC chip 300 receives cyclical signal 305 from an off-chip signal source. Alternatively, cyclical signal 305 may be a reference clock signal generated at IC chip 300, or may be a clock signal which is generated based on such a reference clock signal.

In the example embodiment shown, PLL circuit 310 includes a phase-frequency detector PFD 312 that receives a cyclical signal 305 and a feedback signal 332. Based on a phase difference between these two signals 305, 332, PFD 312 may provide a corresponding up or down signal to a charge pump CP 314. A voltage controlled oscillator (VCO) 318 of PLL circuit 310 generates a clock signal 320 (e.g., RClk 142) at a frequency that is based—directly or indirectly—on a signal which is output by CP 314. For example, an up signal from PFD 312 may result in an output from CP 314 which causes VCO 318 to increase the frequency of clock signal 320 (e.g., where a down signal instead results in VCO 318 decreasing the frequency).

In some embodiments, PLL circuit 310 further comprises a loop filter LF 316 between CP 314 and VCO 318—e.g., wherein LF 316 filters a high frequency signal component from the output of CP 314 to create a lower frequency signal 317 that may be used to control VCO 318. Signal 317 is merely one example of a signal which provides a control voltage to operate VCO 318. In other embodiments (for example) PLL circuit 310 omits LF 316—e.g., wherein signal 317 is instead received by VCO 318 directly from CP 314. A frequency divider circuit DIV 330 may apply frequency multiplication to a version of clock signal 320 which is fed back from VCO 318—e.g., wherein DIV 330 provides the resulting feedback signal 332 to PFD 312.

The frequency of clock signal 320 generated by the PLL circuit 310 may initially vary. Eventually, however, the PLL circuit 310 "locks" and clock signal 320 remains at an appropriate frequency (e.g., based on the frequency of cyclical signal 305 and the value of a frequency multiplication factor N applied by DIV 330). In an embodiment, a frequency multiplication factor N applied by DIV 330 is based on a control signal DMC 340 which indicates a clock frequency which is requested for clock signal 320. Control signal DMC 340 may be signal 172, for example. In one embodiment, DMC 340 requests a frequency based on a modem, I/O stack or other circuitry (not shown) of IC chip 300 detecting that RF signal interference may be due to clock signal 320 being in a particular frequency range.

Operation of PLL circuit 310 is powered at least in part with a supply voltage 362. For example, a voltage regulator VR 360 of IC chip 300 may generate supply voltage 362 based on a rail voltage $V_{cc}$, and provide supply voltage 362 to VCO 318 (and, in some embodiments, to other components of PLL circuit 310) for powering functionality which, based on a voltage of signal 317, controls a frequency of clock signal 320.

During operation of 300, supply voltage 362 may be updated in response to an indication of a state (actual or expected) of IC chip 300, wherein the state is based on, or contributes to, clock signal 320 being provided by PLL circuit 310. The state may comprise one or more constituent conditions which, for example, include a frequency for clock signal 320 which is requested with DMC 340, a frequency (actual or expected) of cyclical signal 305, or a voltage of signal 317.

In the example embodiment shown, supply voltage 362 is updated at least based on a requested frequency for clock signal 320. For example, IC chip 300 further comprises circuitry—such as the illustrative decoder 350 shown—which is configured to monitor DMC 340 and to determine whether, based on a frequency requested for clock signal 320, a level of supply voltage 362 is to be updated. At a given time, a current level of supply voltage 362 may limit clock signal 320 to a corresponding maximum frequency which—given said current level of supply voltage 362—VCO 318 can support. Alternatively or in addition, the current level of supply voltage 362 may limit VCO 318 to providing a particular maximum gain of clock signal 320. In such an embodiment, decoder 350 may determine that DMC 340 requests a frequency which would require an increase to supply voltage 362 (or alternatively, which would allow for a decrease to supply voltage 362). Based on the requested frequency, decoder 350 may provide a control signal 352 which causes VR 360 to update a level of supply voltage 362 accordingly. Control signal 352 may specify or otherwise indicate to VR 360 a risk that VCO 318 does not have, or may soon not have, enough power to support a requested frequency—e.g., wherein decoder 350 provides some or all of the functionally to controller 170.

Figure 4:
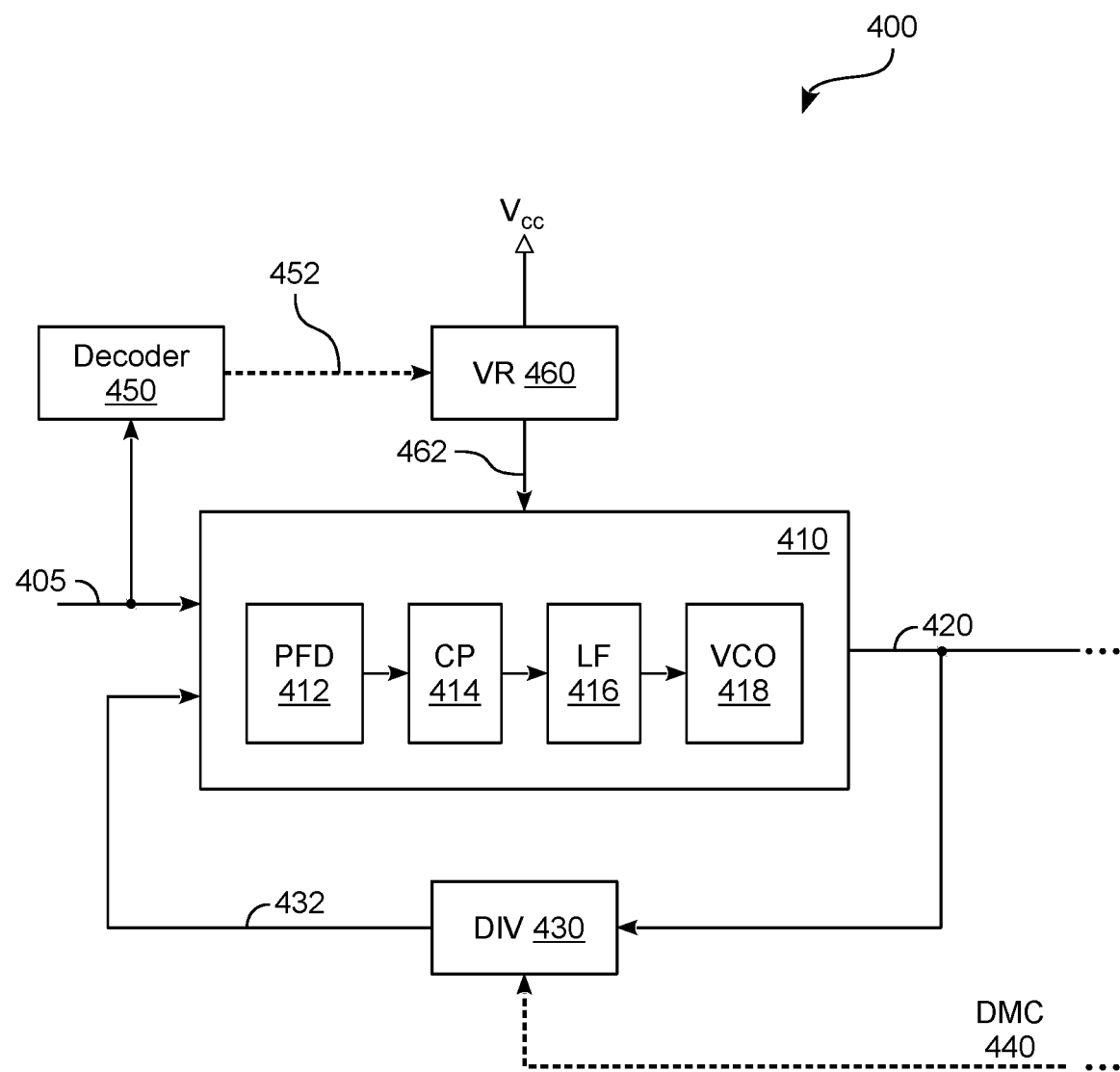

FIG. 4 shows features of an IC chip 400 to generate a clock signal according to another embodiment. IC chip 400 is one example of an embodiment wherein circuitry of a chip is operable to update a supply voltage based on a frequency of a cyclical signal, wherein a clock signal is generated based on both the supply voltage and the cyclical signal. IC chip 400 may include features of one of IC chips 130, 300 and/or may operate according to method 200, for example.

As shown in FIG. 4, IC chip 400 includes a voltage regulator circuit VR 460 and PLL circuitry 410 which, for example, correspond functionally to VR 360 and PLL circuitry 310 (respectively). PLL circuitry 410 may generate a clock signal 420 based on a cyclical signal 405. Clock signal 420 may be a reference clock signal—e.g., wherein IC chip 400 receives cyclical signal 405 from an off-chip signal source. Alternatively, cyclical signal 405 may be a reference clock signal generated at IC chip 400, or may be a clock signal which is generated based on such a reference clock signal. The clock signal 420 may be further based on a supply voltage 462 which is provided by VR 460 to PLL circuitry 410 (e.g., where supply voltage 462 is generated with VR 460 based on rail voltage $V_{cc}$).

For example, PLL circuitry 410 may include a phase-frequency detector PFD 412, a charge pump CP 414, a loop filter LF 416, and a voltage controlled oscillator VCO 418 (e.g., corresponding functionally to PFD 312, CP 314, LF 316, and VCO 318). A frequency divider circuit DIV 430, which is included in or coupled to PLL circuitry 410, may generate a feedback signal 432 (e.g., having features of feedback signal 332) by applying frequency multiplication to a version of clock signal 420 which is fed back from VCO 418. A frequency multiplication factor N applied by DIV 430 may be based on a control signal DMC 440 which indicates a clock frequency requested of clock signal 420.

At a given time, a current frequency of cyclical signal 405 (in combination with a current level of supply voltage 462) may limit clock signal 420 to a corresponding maximum frequency which VCO 418 can provide. If, while PLL circuit 410 is providing a previously-requested frequency for clock signal 420, the frequency of cyclical signal 405 were to decrease, then this frequency which VCO 418 can provide would also decrease. In turn, this increases the risk of clock signal 420 failing to meet operational frequency requirements of a processor or other resource of IC chip 400. Alternatively or in addition, a current frequency of cyclical signal 405 (in combination with a current level of supply voltage 462) may require that clock signal 420 have at least a corresponding minimum frequency which VCO 418 must provide. If, while PLL circuit 410 is providing a previously-requested frequency for clock signal 420, the frequency of cyclical signal 405 were to increase, then this minimum frequency which VCO 418 must provide would also increase. In turn, this may risk clock signal 420 violating one or more operational frequency requirements. To mitigate such risks, some embodiments monitor a frequency of cyclical signal 405 and automatically update a level of supply voltage 462 based on said frequency, thus facilitating an effective frequency response of PLL circuit 410 in the generation of clock signal 420.

In the example embodiment shown, supply voltage 462 is updated at least based on a frequency (actual or expected) of cyclical signal 405. For example, IC chip 400 further comprises circuitry—such as the illustrative decoder 450 shown—which is configured to monitor cyclical signal 405 and to determine whether, based on a frequency of cyclical signal 405, a level of supply voltage 462 is to be updated. Based on the detected frequency, decoder 450 may provide a control signal 452 which causes VR 460 to update a level of supply voltage 462 accordingly. Control signal 452 may specify or otherwise indicate to VR 460 a risk that—given the detected frequency of cyclical signal 405—VCO 418 does not have, or may soon not have, enough power to support a requested frequency.

Figure 5:
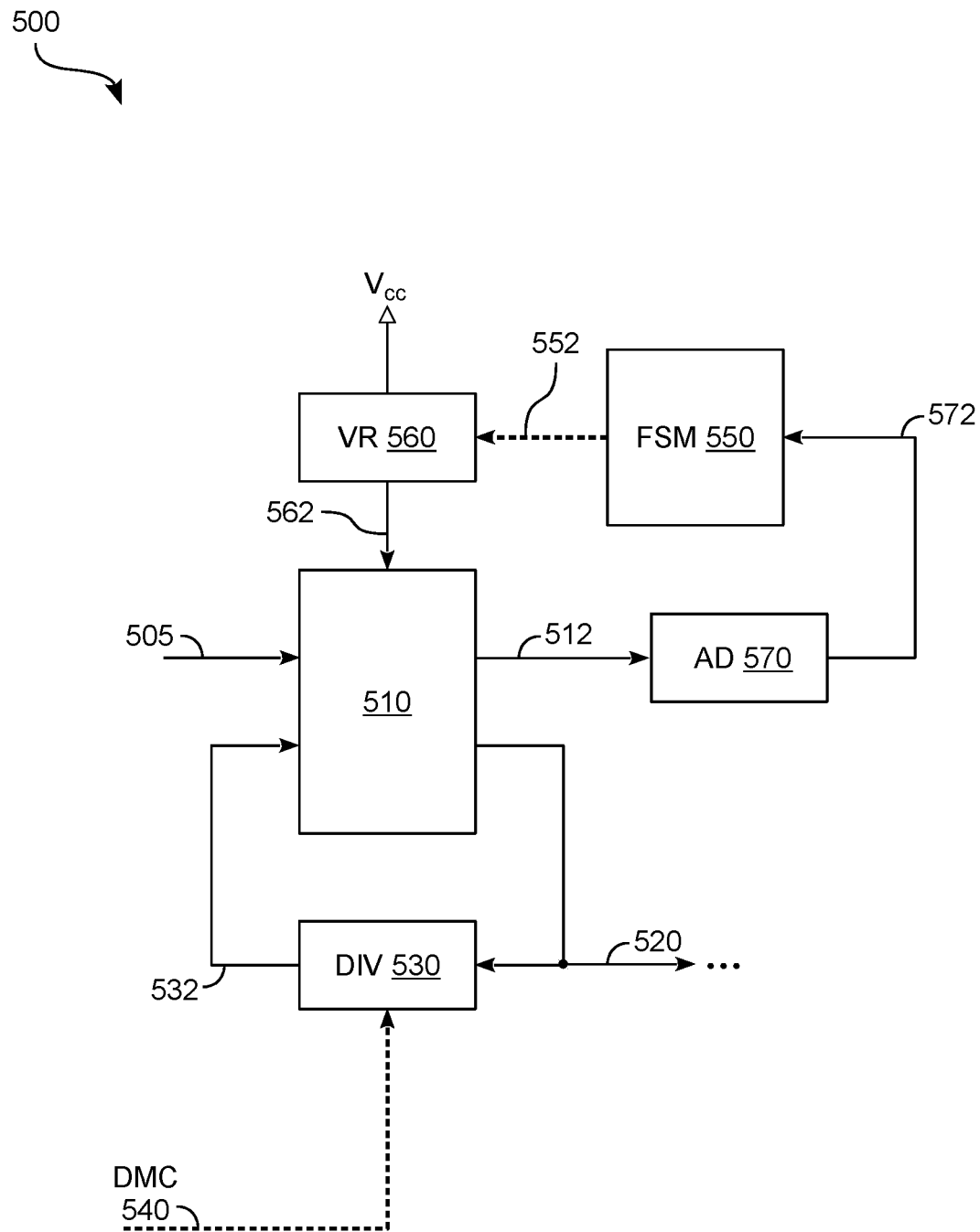

FIG. 5 shows features of an IC chip 500 to generate a clock signal according to another embodiment. IC chip 500 is one example of an embodiment wherein circuitry of a chip is operable to update a supply voltage based on a control signal used by PLL circuitry of the chip, wherein a clock signal is generated with the PLL circuitry based on the supply voltage. IC chip 500 may include features of one of IC chips 130, 300, 400 and/or may operate according to method 200, for example.

As shown in FIG. 5, IC chip 500 includes a voltage regulator circuit VR 560 and PLL circuitry 510 (Replace "510" in the figure with "PLL 510") which, for example, correspond functionally to VR 360 and PLL circuitry 310 (respectively). PLL circuitry 510 may generate a clock signal 520 based on a cyclical signal 505. Clock signal 520 may be a reference clock signal—e.g., wherein IC chip 500 receives cyclical signal 505 from an off-chip signal source. Alternatively, cyclical signal 505 may be a reference clock signal generated at IC chip 500, or may be a clock signal which is generated based on such a reference clock signal.

For example, a frequency divider circuit DIV 530, which is included in or coupled to PLL circuitry 510, may generate a feedback signal 532 (such as signal 332) by applying frequency multiplication to a version of clock signal 520 which is fed back from a voltage controlled oscillator (not shown) of PLL circuitry 510. A frequency multiplication factor N applied by DIV 530 may be based on a control signal DMC 540 which indicates a clock frequency requested for clock signal 520.

Clock signal 520 may be further based on a supply voltage 562 (same comments as above) which is provided by VR 560 to PLL circuitry 510 (e.g., where supply voltage 562 is generated with VR 560 based on a rail voltage $V_{cc}$). In the example embodiment shown, supply voltage 562 is updated at least based on a control signal used at PLL circuitry 510. For example, at a given time, a control signal 512—e.g., providing functionality of signal 317—may be provided to a VCO circuit (not shown) of PLL circuitry 510 to control a frequency of clock signal 520. In such an embodiment, control signal 512 may be further provided to additional circuitry of IC chip 500 which detects whether, according to some predefined criteria, a level of supply voltage 562 needs to be changed. For example, such additional circuitry may comprise an analog-to-digital circuit AD 570 and a finite state machine FSM 550 coupled thereto. In such an embodiment, AD 570 may output a signal 572 including a digital code which specifies a voltage level of control signal 512. Responsive to signal 572, FSM 550 may determine whether the indicated voltage level exceeds a threshold voltage level corresponding to a current level of supply voltage 562.

If such a threshold voltage level is exceeded, FSM 550 may provide a control signal 552 which causes VR 560 to update a level of supply voltage 562 accordingly. Control signal 552 may specify or otherwise indicate to VR 560 a risk that—given the detected level of control signal 512—VCO 518 does not have, or may soon not have, enough power to support a frequency corresponding to said detected level.

Figure 6:
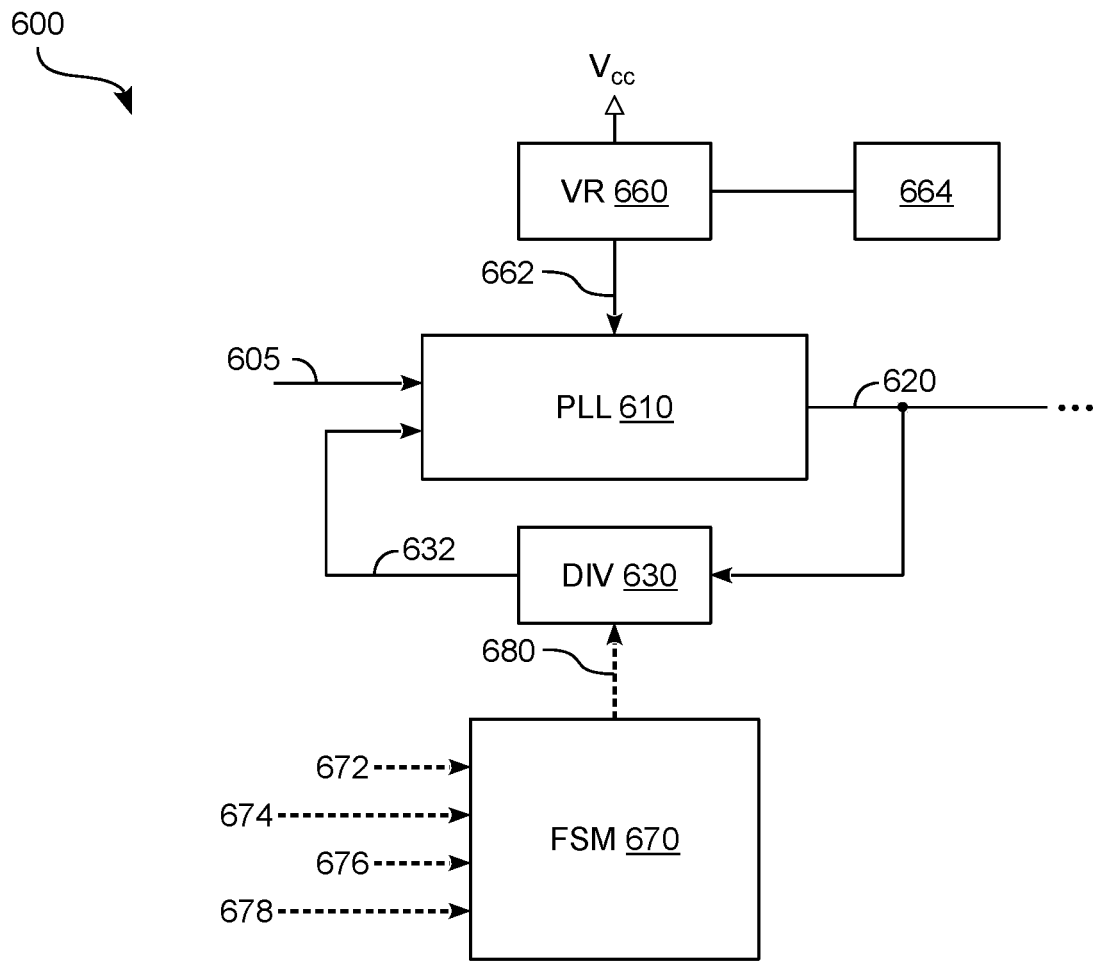
Figure 6:
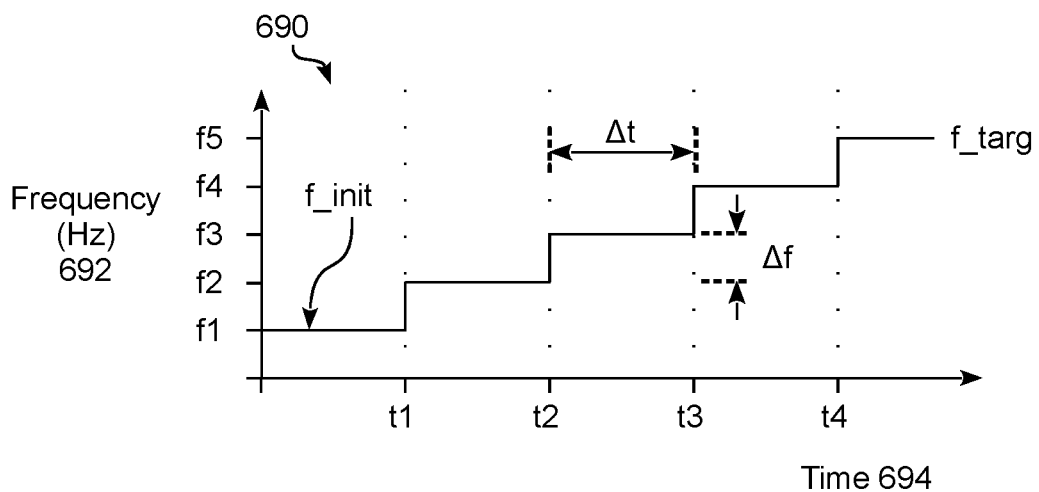

FIG. 6 shows features of an IC chip 600 which is to automatically perform a frequency crawl while providing a clock signal according to an embodiment. IC chip 600 may include features of one of IC chips 130, 300, 400, 500, for example. Alternatively or in addition, IC chip 600 may operate according to method 200.

As shown in FIG. 6, IC chip 600 includes a voltage regulator circuit VR 660, PLL circuitry 610 and a frequency divider circuit DIV 630 which, for example, correspond functionally to VR 360, PLL circuitry 310 and DIV 330 (respectively). Operation of PLL circuitry 610 may generate a clock signal 620 based on a cyclical signal 605. Generation of clock signal 620 may be further based on a feedback signal 632 from DIV 630 and a supply voltage 662 which is provided by VR 660 to PLL circuitry 610 (e.g., where supply voltage 662 is generated with VR 660 based on rail voltage $V_{cc}$). In one such embodiment, DIV 630 facilitates a clocking scheme for implementing a frequency crawl. The clocking scheme may identify incremental changes to be made to feedback signal 632 and thus, corresponding incremental changes to be made to a frequency of clock signal 620.

For example, DIV 630 may include or otherwise have access to circuit logic (such as the illustrative finite state machine FSM 670 shown) which provides a signal 680 indicating a value for a frequency multiplication factor N which DIV 330 is to apply to generate feedback signal 632. Signal 680 may be sequentially updated by FSM 670 to change the value of N over a period of time. For example, during operation of IC chip 600, a clocking scheme may be specified or otherwise indicated to FSM 670 by one or more control signals, such as the illustrative control signals 672, 674, 676, 678 shown. Such signaling may be received from a processor, power management controller or other resource (not shown) of IC chip 600. Various embodiments are not limited to a particular agent which identifies a given clocking scheme to FSM 670.

Based on control signals 672, 674, 676, 678, FSM 670 may detect that a particular clocking scheme is to be implemented—e.g., where FSM 670 identifies one or more parameters of the clocking scheme. Such one or more parameters may include, for example, a magnitude of an incremental frequency increase, a duration of an incremental frequency increase, or a final target frequency. By way of illustration and not limitation, control signal 672 may indicate to FSM 670 a frequency f_init of clock signal 620 at a beginning of a frequency crawl (e.g., where control signal 672 indicates a corresponding initial value of the frequency multiplication factor N applied by DIV 630). In such an embodiment, control signal 674 may indicate to FSM 670 a target frequency f_targ for clock signal 620 at an end of the frequency crawl (e.g., where control signal 674 indicates a corresponding final value of the frequency multiplication factor N applied by DIV 630). Alternatively or in addition, control signal 676 may indicate to FSM 670 a magnitude Δf of an incremental change to the frequency of clock signal 620 (e.g., where control signal 676 indicates a corresponding magnitude of an incremental change to the frequency multiplication factor N applied by DIV 630). Alternatively or in addition, control signal 678 may indicate to FSM 670 a time duration Δt of a given frequency step of clock signal 620 during a frequency crawl.

In one embodiment, FSM 670 signals DIV 630 to implement an overclocking scheme wherein a frequency of clock signal 620 is successively increased from some current frequency (e.g., f_init) to some target frequency (e.g., f_targ). FIG. 6 also shows a graph 690 illustrating one example of such a frequency crawl—i.e., where graph 690 plots incremental changes to a clock frequency 692 over a time domain 694.

Performance of a frequency crawl by IC chip 600 may include or otherwise result in a level of supply voltage 662 being automatically changed by VR 660. For example, IC chip 600 may further comprise a controller 664—e.g., providing functionality such as that of controller 170, decoder 350, decoder 450 or FSM 550—which is coupled to monitor one or more of a frequency requested by signal 680, a frequency of cyclical signal 605 or a level of a control voltage (not shown) which controls a VCO functionality of PLL 610. Such monitoring may include or be a basis for the evaluation performed at 240 of method 200, for example. Based on a result of such evaluating, controller 664 may send to VR 660 a control signal to change supply voltage 662.

Figure 7:
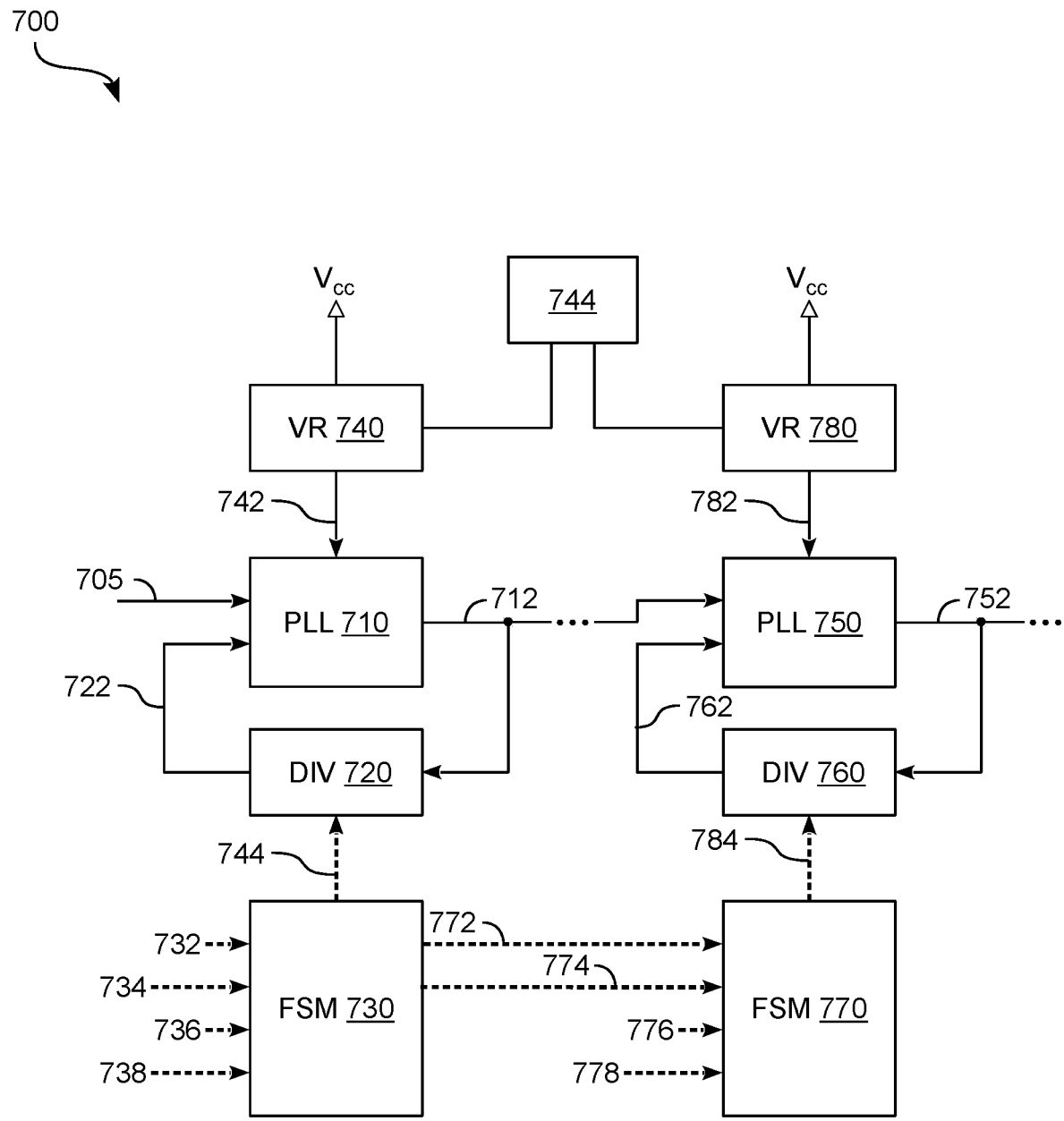

FIG. 7 shows features of an IC chip 700 which is to automatically perform a frequency crawl while providing a clock signal according to an embodiment. IC chip 700 may include features of one of IC chip 600—e.g., where IC chip 700 operates according to method 200.

As shown in FIG. 7, IC chip 700 includes a voltage regulator circuit VR 740, PLL circuitry 710, a frequency divider circuit DIV 720, and a finite state machine 720 which, for example, correspond functionally to VR 660, PLL circuitry 610, DIV 630, and FSM 670 (respectively). VR 740 generates a supply voltage 742 based on a rail voltage $V_{cc}$, and PLL circuitry 710 generates a clock signal 712 based on each of supply voltage 742, a feedback signal 722 from DIV 712 and a cyclical signal 705.

Operation of FSM 730 with DIV 720 may facilitate a first clocking scheme (e.g., a first overclocking scheme) for a first frequency crawl of clock signal 712. For example, FSM 730 may provide a signal 744 which indicates to DIV 720 a frequency multiplication factor N1 which DIV 720 is to apply to generate feedback signal 732. Signal 744 may be sequentially updated by FSM 730 to change the value of N over a period of time. In the example embodiment shown, such updating of signal 744 by FSM 730 is based on control signals 732, 734, 736, 738 (e.g., corresponding functionally to control signals 672, 674, 676, 678, respectively) which identify one or more parameters of the first clocking scheme.

In such an embodiment, clock signal 712 may be provided to other resources of IC chip 700 which are to generate one or more clock signals based on clock signal 712. Such other resources may further facilitate a second clocking scheme—e.g., concurrent with the first clocking scheme—for a second frequency crawl of a given one of the one or more clock signals.

For example, IC chip 700 may further include a voltage regulator circuit VR 780, PLL circuitry 750, a frequency divider circuit DIV 760, and a finite state machine 760 which, for example, correspond functionally to VR 660, PLL circuitry 610, DIV 630, and FSM 670 (respectively). VR 780 generates a supply voltage 782 based on rail voltage $V_{cc}$, and PLL circuitry 750 generates another clock signal 752 based on each of supply voltage 782, a feedback signal 762 from DIV 752 and clock signal 712.

Operation of FSM 770 with DIV 760 may facilitate a second clocking scheme (e.g., a second overclocking scheme or, alternatively, an underclocking scheme) for a second frequency crawl of clock signal 752. For example, FSM 770 may provide a signal 784 which indicates to DIV 760 a frequency multiplication factor N2 which DIV 760 is to apply to generate feedback signal 762. Signal 784 may be sequentially updated by FSM 770 to change the value of N2 over a period of time. In the example embodiment shown, such updating of signal 784 by FSM 770 is based on control signals 772, 774, 776, 778 which identify one or more parameters of the second clocking scheme. By way of illustration and not limitation, control signal 772 may indicate to FSM 770 an initial frequency of clock signal 752 at a beginning of the second frequency crawl—e.g., where control signal 774 indicates a target frequency for clock signal 752 at an end of the second frequency crawl. Alternatively or in addition, control signal 776 may indicate to FSM 770 a magnitude of an incremental change to the frequency of clock signal 752—e.g., where control signal 778 indicates a time duration of a given frequency step of clock signal 752 during the second frequency crawl.

Performance of a frequency crawl by IC chip 700 may include or otherwise result in supply voltage 742 being automatically changed with VR 740 and/or supply voltage 782 being automatically changed with VR 780. For example, IC chip 700 may further comprise a controller 744—e.g., providing functionality such as that of controller 664—which is coupled to monitor one or more of a frequency requested by signal 744, a frequency of cyclical signal 705 or a level of a control voltage (not shown) which controls a VCO functionality of PLL 710. Alternatively or in addition, controller 744 may be coupled to monitor one or more of a frequency requested by signal 784, a frequency of signal 712 or a level of a control voltage (not shown) which controls a VCO functionality of PLL 750. Such monitoring may include or be a basis for the evaluation performed at 240 of method 200, for example. Based on a result of such evaluating, controller 744 may send to VR 740 a control signal to change supply voltage 742 (and/or may send to VR 780 a control signal to change supply voltage 782).

By enabling concurrent frequency crawls for respective clock signals—where one such clock signal is based on another such clock signal—various embodiments provide for very efficient and granular configuration of different clock domains. By way of illustration and not limitation, the second clocking scheme for clock signal 752 may at least partially mitigate an increase from the first clocking scheme for clock signal 712.

Figure 8:
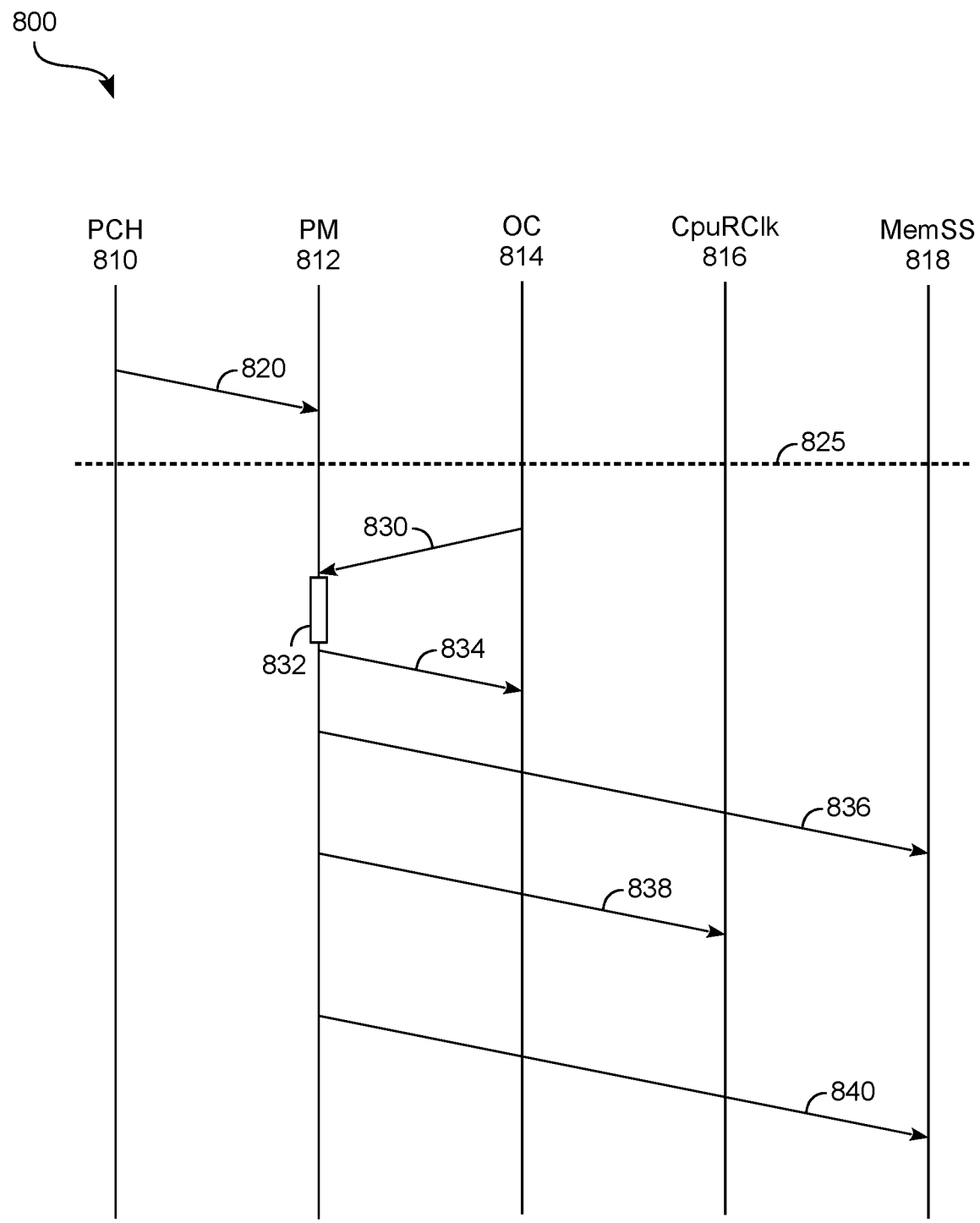
FIG. 8 is a swim lane diagram illustrating elements of communications exchanged at an IC chip according to an embodiment.

FIG. 8 shows a swim lane diagram 800 illustrating communications to determine a frequency of a clock according to an embodiment. More particularly, swim lane diagram 800 shows various communications among resources of an IC chip to implement a cold boot-up—i.e., the resources including a swim lane diagram 800, a platform controller hub PCH 810, a power management process PM 812, a clocking management process OC 814, a clock control logic CpuRClk 816, and a memory subsystem MemSS 818. Such communications may be performed with one of IC chips 130, 300, 400, 500, 600, 700, for example.

As shown in FIG. 8, a cold boot of the IC chip may comprise PCH 810 sending to PM 812 a message 820 to wake up resources of the IC chip—e.g., the resources including one or more processor cores. Such resources may operate based on a reference clock signal RClk which, as described herein, is generated on-chip by CpuRClk 816 based on a cyclical signal which the IC chip receives from an external source. CpuRClk 816 may provide functionality to perform some or all of method 200—e.g., wherein CpuRClk 816 has some or all of the features of PLL 140, VR 150 and controller 170.

In an embodiment, an initial frequency of RClk is specified with message 820 or, alternatively, is determined by a default frequency which is predefined at PM 812. At a particular time (indicated by the line 825 shown), BIOS operations of the cold boot may be completed based on message 820. Subsequently, OC 814 may send to PM 812 a request 830 for a particular frequency of RClk. Request 830 may be based on operations—e.g., adapted from conventional processor management/monitoring techniques—which identify whether some state of the IC chip requires, or otherwise allows for, overclocking of RClk (or, alternatively, an end to such overclocking).

In response to request 830, PM 812 may perform operations 832 to compute one or more parameters for configuring CpuRClk 816 to provide the indicated frequency for RClk. By way of illustration and not limitation, such one or more parameters may include a frequency multiplication factor to be applied with PLL feedback circuitry of CpuRClk 816. Alternatively or in addition, operations 832 may perform a lookup or other calculation to identify one or more parameters of a frequency crawl scheme—e.g., the one or more parameters including a target frequency for RClk, a magnitude of an incremental frequency change to RClk, a duration of an incremental frequency change to RClk, or the like.

After operations 832 are successfully completed, PM 812 may communicate to OC 814 a message 834 confirming acceptance of request 830. In addition, PM 812 may communicate to MemSS 818 a message 836 to block at least some resources of MemSS 818 from operating during a change to the frequency of RClk. A message 838 to CpuRclk 816 may then facilitate one or more changes to the frequency of RClk—e.g., wherein message 838 corresponds functionally to signal 172. After the one or more frequency changes to RClk has been completed, PM 812 may send to MemSS 818 a message 840 to unblock operation of memory resources.

Figure 9:
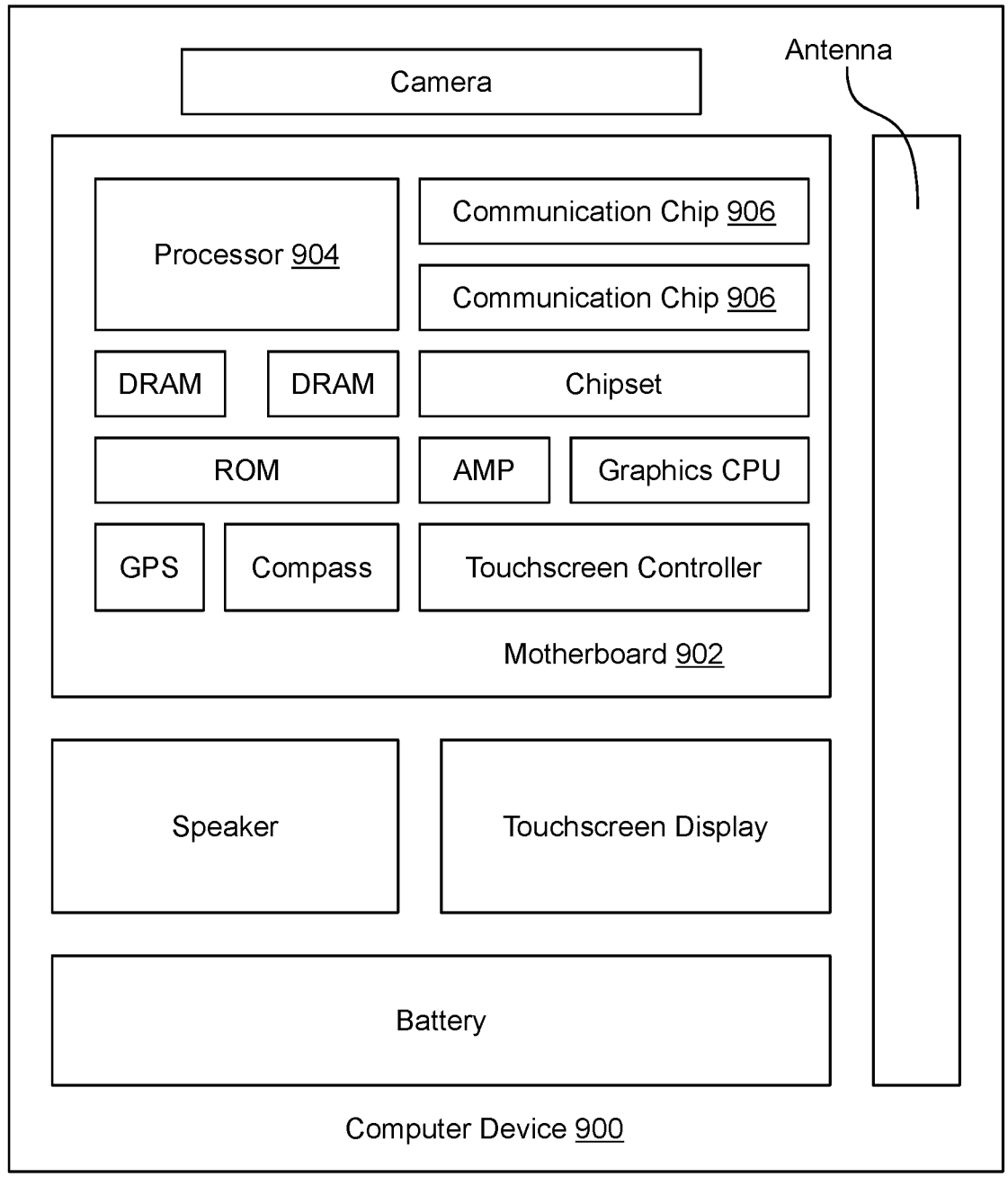
FIG. 9 is a functional block diagram illustrating a computing device in accordance with one embodiment.

FIG. 9 illustrates a computing device 900 in accordance with one embodiment. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

Depending on its applications, computing device 900 may include other components that may or may not be physically and electrically coupled to the board 902. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 includes an integrated circuit die packaged within the processor 904. The term "processor" may refer to any device or portion of a device that processes electronic data from registers and/or memory to transform that electronic data into other electronic data that may be stored in registers and/or memory. The communication chip 906 also includes an integrated circuit die packaged within the communication chip 906.

In various implementations, the computing device 900 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

Some embodiments may be provided as a computer program product, or software, that may include a machine-readable medium having stored thereon instructions, which may be used to program a computer system (or other electronic devices) to perform a process according to an embodiment. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 10:
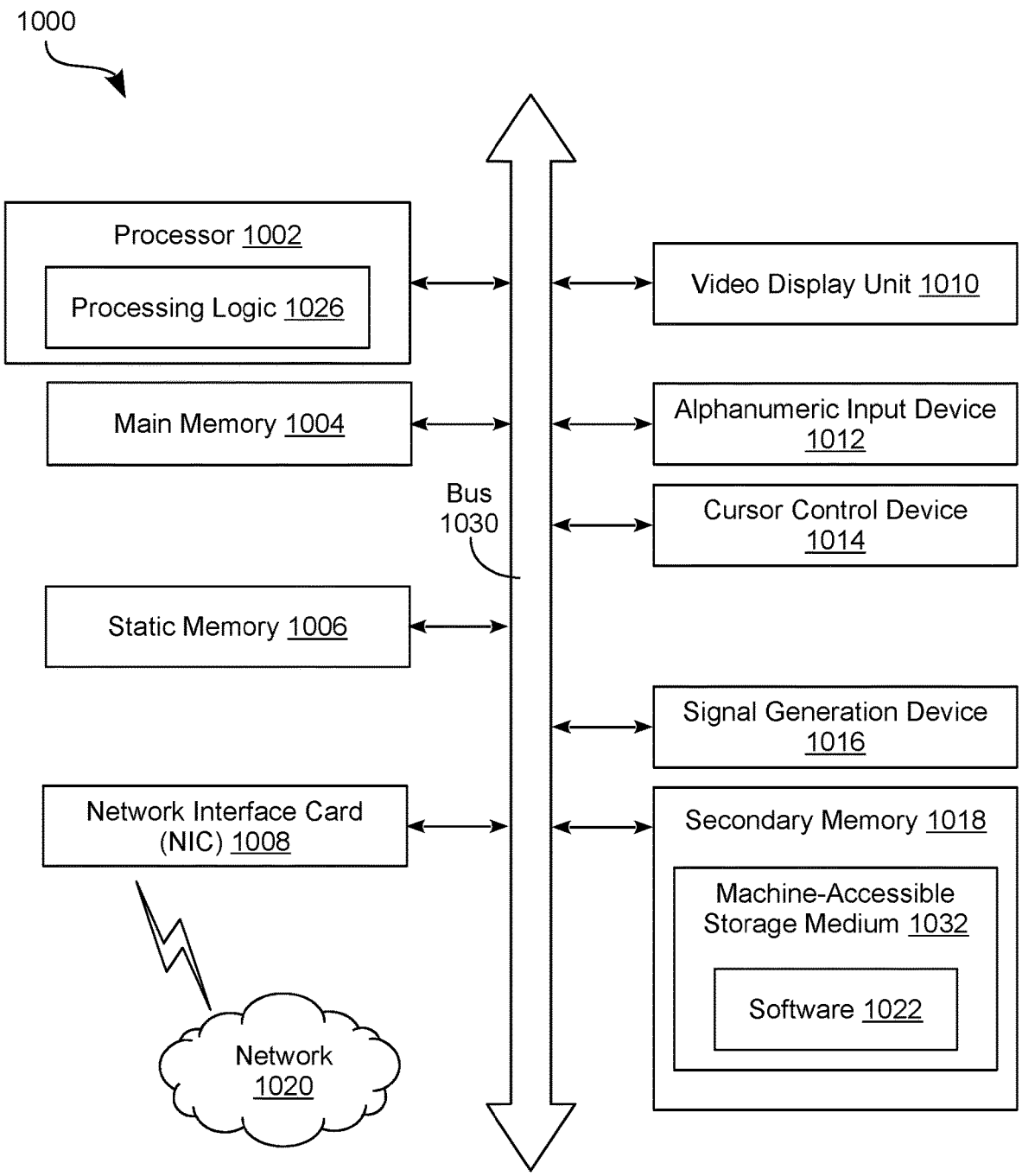
FIG. 10 is a functional block diagram illustrating an exemplary computer system, in accordance with one embodiment.

FIG. 10 illustrates a diagrammatic representation of a machine in the exemplary form of a computer system 1000 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 1000 includes a processor 1002, a main memory 1004 (e.g., read-only memory (ROM), flash memory, dynamic random access memory (DRAM) such as synchronous DRAM (SDRAM) or Rambus DRAM (RDRAM), etc.), a static memory 1006 (e.g., flash memory, static random access memory (SRAM), etc.), and a secondary memory 1018 (e.g., a data storage device), which communicate with each other via a bus 1030.

Processor 1002 represents one or more general-purpose processing devices such as a microprocessor, central processing unit, or the like. More particularly, the processor 1002 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 1002 may also be one or more special-purpose processing devices such as an application specific integrated circuit (ASIC), a field programmable gate array (FPGA), a digital signal processor (DSP), network processor, or the like. Processor 1002 is configured to execute the processing logic 1026 for performing the operations described herein.

The computer system 1000 may further include a network interface device 1008. The computer system 1000 also may include a video display unit 1010 (e.g., a liquid crystal display (LCD), a light emitting diode display (LED), or a cathode ray tube (CRT)), an alphanumeric input device 1012 (e.g., a keyboard), a cursor control device 1014 (e.g., a mouse), and a signal generation device 1016 (e.g., a speaker).

The secondary memory 1018 may include a machine-accessible storage medium (or more specifically a computer-readable storage medium) 1032 on which is stored one or more sets of instructions (e.g., software 1022) embodying any one or more of the methodologies or functions described herein. The software 1022 may also reside, completely or at least partially, within the main memory 1004 and/or within the processor 1002 during execution thereof by the computer system 1000, the main memory 1004 and the processor 1002 also constituting machine-readable storage media. The software 1022 may further be transmitted or received over a network 1020 via the network interface device 1008.

While the machine-accessible storage medium 1032 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any of one or more embodiments. The term "machine-readable storage medium" shall accordingly be taken to include, but not be limited to, solid-state memories, and optical and magnetic media.

In one implementation, a method at an integrated circuit (IC) chip comprises providing a cyclical signal to a first circuit of the IC chip, with phase-lock loop (PLL) circuitry of the first circuit, generating a clock signal based on both the cyclical signal and a supply voltage provided to the PLL circuitry, with a second circuit, performing an evaluation of one of a frequency requested on behalf of a processor, a frequency of the cyclical signal, or a level of a control voltage at the PLL circuitry, the evaluation based on a predefined threshold level, and regulating the supply voltage with a control signal based on the evaluation, comprising automatically changing a level of the supply voltage in response to the control signal.

In an embodiment, the cyclical signal is an analog signal provided to the IC chip from an external source. In another embodiment, performing the evaluation comprises detecting that the frequency requested on behalf of the processor is greater than a predefined threshold frequency of the clock signal, the predefined threshold frequency corresponding to a current level of the supply voltage, wherein the method further comprises with the first circuit, increasing a frequency of the clock signal according to the frequency requested on behalf of the processor. In another embodiment, performing the evaluation comprises detecting that the frequency of the cyclical signal is less than a predefined threshold frequency of the cyclical signal, the predefined threshold frequency corresponding to a current frequency of the clock signal. In another embodiment, performing the evaluation comprises detecting that the control voltage at the PLL circuitry is greater than a predefined threshold level of the control voltage, the predefined threshold level corresponding to a current level of the supply voltage. In another embodiment, the evaluation is performed further based on predefined reference information which corresponds threshold levels of a parameter each with a different respective level of the supply voltage, wherein the parameter comprises one of a requested clock frequency parameter, a cyclical signal frequency parameter, or a control voltage level parameter.

In another embodiment, the method further comprises, with the second circuit, accessing one or more parameters of an overclock scheme, and signaling the first circuit, based on the one or more parameters, to perform a series of incremental increases to a frequency of the clock signal. In another embodiment, the one or more parameters specify one of a magnitude of an incremental frequency increase, a duration of the incremental frequency increase, or a final target frequency of the clock signal. In another embodiment, the method further comprises, with the VR circuit, automatically increasing the level of the supply voltage during the series of incremental increases to the frequency of the clock signal. In another embodiment, the first circuit is a first reference clock generator circuit, and wherein the second circuit is a first control circuit, wherein the method further comprises providing the clock signal to a second reference clock generator circuit, with the second reference clock generator circuit, generating a second clock signal based on the clock signal, and during the series of incremental increases to the frequency of the clock signal, signaling the second control circuit to perform a series of incremental changes to a frequency of the second clock signal. In another embodiment, the overclock scheme is a first overclock scheme, wherein the series of incremental changes to the frequency of the second clock signal is based on a second overclock scheme. In another embodiment, the second overclock scheme to at least partially mitigates an increase to the frequency of the second clock signal which would otherwise result from the series of incremental increases to the frequency of the clock signal. In another embodiment, the method further comprises operating a processor of the IC chip based on the clock signal.

Techniques and architectures for generating a reference clock signal are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. An integrated circuit (IC) chip to provide clock signaling, the IC chip comprising:

a first phase-lock loop (PLL) circuit to receive a cyclical signal and a supply voltage, the first PLL circuit further to generate a first clock signal based on both the cyclical signal and the supply voltage; and a first circuit coupled to the first PLL circuit, the first circuit to perform an evaluation of one of a requested frequency to be provided with the first clock signal, a frequency of the cyclical signal, or a level of a control voltage at the first PLL circuit, the first circuit further to automatically generate a control signal based on the evaluation, the control signal to automatically change a level of the supply voltage, wherein the first circuit is to access one or more parameters of an overclock scheme, and to signal the first PLL circuit, based on the one or more parameters, to perform a series of incremental changes to a frequency of the first clock signal;

a second PLL circuit to receive the first clock signal from the first PLL circuit, and to generate a second clock signal based on the first clock signal; and a second circuit coupled to the second PLL circuit, the second circuit to signal the second PLL circuit to change a frequency of the second clock signal.

2. The IC chip of claim 1, wherein the cyclical signal is an analog signal provided to the IC chip from an external source.

3. The IC chip of claim 1, wherein the first circuit to perform the evaluation comprises the first circuit to detect that the requested frequency is greater than a threshold frequency of the first clock signal, wherein the control signal is to automatically increase the level of the supply voltage.

4. The IC chip of claim 3, wherein the first PLL circuit is further to increase a frequency of the first clock signal, after the level of the supply voltage is automatically increased, according to the requested frequency.

5. The IC chip of claim 1, wherein the first circuit to perform the evaluation comprises the first circuit to detect that the frequency of the cyclical signal is less than a threshold frequency of the cyclical signal, wherein the control signal is to automatically decrease the level of the supply voltage.

6. The IC chip of claim 1, wherein the first circuit to perform the evaluation comprises the first circuit to detect that the control voltage at the first PLL circuit is greater than a threshold level of the control voltage, wherein the control signal is to automatically increase the level of the supply voltage.

7. The IC chip of claim 1, wherein the one or more parameters specify one of:
   a magnitude of an incremental frequency increase;
   a duration of the incremental frequency increase; or
   a final target frequency of the first clock signal.

8. The IC chip of claim 1, wherein the control signal is to automatically increase the level of the supply voltage during the series of incremental changes to the frequency of the first clock signal.

9. The IC chip of claim 1, wherein the second control circuit to signal the second PLL circuit to change the frequency of the second clock signal comprises the second control circuit to signal the second PLL circuit, during the series of incremental increases to the frequency of the clock signal, to perform a series of incremental changes to the frequency of the second clock signal.

10. An integrated circuit (IC) chip to provide clock signaling, the IC chip comprising:
   a first circuit coupled to receive a cyclical signal;
   a second circuit coupled to provide a supply voltage to first phase-lock loop (PLL) circuitry of the first circuit, the first PLL circuitry to generate a first clock signal based on both the cyclical signal and the supply voltage;

a third circuit to perform an evaluation of one of a frequency requested on behalf of a processor, a frequency of the cyclical signal, or a level of a control voltage at the first PLL circuitry, the evaluation based on a predefined threshold level, and to automatically provide to the second circuit a control signal based on the evaluation, wherein the third circuit is further to access one or more parameters of an overclock scheme, and to signal the first circuit, based on the one or more parameters, to perform a series of incremental changes to a frequency of the first clock signal, wherein, responsive to the control signal, the second circuit to automatically change a level of the supply voltage during the series of incremental changes to the frequency of the first clock signal;

a fourth circuit coupled to receive the first clock signal from the first PLL circuitry, the fourth circuit comprising second PLL circuitry to generate a second clock signal based on the first clock signal; and a fifth circuit coupled to the fourth circuit, the fifth circuit to signal the second PLL circuitry to change a frequency of the second clock signal.

11. The IC chip of claim 10, wherein the cyclical signal is an analog signal provided to the IC chip from an external source.

12. The IC chip of claim 10, wherein the third circuit to perform the evaluation comprises the third circuit to detect that the frequency requested on behalf of the processor is greater than a predefined threshold frequency of the first clock signal, wherein the second circuit is to automatically increase the level of the supply voltage responsive to the control signal, wherein the predefined threshold frequency corresponds to a current level of the supply voltage.

13. The IC chip of claim 10, wherein the third circuit to perform the evaluation comprises the third circuit to detect that the frequency of the cyclical signal is less than a predefined threshold frequency of the cyclical signal, wherein the second circuit is to automatically decrease the level of the supply voltage responsive to the control signal, wherein the predefined threshold frequency corresponds to a current frequency of the first clock signal.

14. The IC chip of claim 10, wherein the third circuit to perform the evaluation comprises the third circuit to detect that the control voltage at the first PLL circuitry is greater than a predefined threshold level of the control voltage, wherein the second circuit is to automatically increase the level of the supply voltage responsive to the control signal, wherein the predefined threshold level corresponds to a current level of the supply voltage.

15. The IC chip of claim 10, wherein the third circuit is to perform the evaluation further based on predefined reference information which corresponds threshold levels of a parameter each with a different respective level of the supply voltage, wherein the parameter comprises one of a requested clock frequency parameter, a cyclical signal frequency parameter, or a control voltage level parameter.

16. A system to provide clock signaling, the system comprising:
   a first integrated circuit (IC) chip comprising:
      a first circuit coupled to receive a cyclical signal;
      a second circuit coupled to provide a supply voltage to phase-lock loop (PLL) circuitry of the first circuit, the PLL circuitry to generate a first clock signal based on both the cyclical signal and the supply voltage;

a third circuit to perform an evaluation of one of a frequency requested on behalf of a processor, a frequency of the cyclical signal, or a level of a control voltage at the PLL circuitry, the evaluation based on a predefined threshold level, and to automatically provide to the second circuit a control signal based on the evaluation, wherein, responsive to the control signal, the second circuit to automatically change a level of the supply voltage, the third circuit further to access one or more parameters of an overclock scheme, and to signal the first circuit, based on the one or more parameters, to perform a series of incremental increases to a frequency of the clock signal, wherein the second circuit is to automatically increase the level of the supply voltage during the series of incremental increases to the frequency of the clock signal;

a fourth circuit to receive the first clock signal from the first circuit, and to generate a second clock signal based on the first clock signal; and a fifth circuit coupled to the fourth circuit, wherein, during the series of incremental increases to the frequency of the first clock signal, the fifth circuit to signal the fourth circuit to change a frequency of the second clock signal;

a second IC chip coupled to provide the cyclical signal to the first IC chip; and a display device coupled to the first IC chip, the display device to generate a display based on a signal communicated using the clock signal.

17. The system of claim 16, wherein the fifth circuit to signal the fourth circuit to change the frequency of the second clock signal comprises the fifth control circuit to signal the second PLL circuit, during the series of incremental increases to the frequency of the clock signal, to perform a series of incremental changes to the frequency of the second clock signal.

* * * * *